United States Patent
Barwicz et al.

(10) Patent No.: US 10,014,274 B2
(45) Date of Patent: *Jul. 3, 2018

(54) OPTIMIZED SOLDER PADS FOR MICROELECTRONIC COMPONENTS

(71) Applicant: INTERNATIONAL BUSINESS MACHINES CORPORATION, Armonk, NY (US)

(72) Inventors: Tymon Barwicz, Yorktown Heights, NY (US); Yves Martin, Ossining, NY (US); Jae-Woong Nah, Closter, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/224,960

(22) Filed: Aug. 1, 2016

(65) Prior Publication Data

US 2017/0141072 A1    May 18, 2017

Related U.S. Application Data

(63) Continuation of application No. 14/941,041, filed on Nov. 13, 2015, now Pat. No. 9,466,590.

(51) Int. Cl.
*H01L 23/495* (2006.01)
*H01L 23/00* (2006.01)
(Continued)

(52) U.S. Cl.
CPC .............. *H01L 24/81* (2013.01); *H01L 24/06* (2013.01); *H01L 24/09* (2013.01); *H01L 24/11* (2013.01);
(Continued)

(58) Field of Classification Search
CPC ................. H01L 23/49503; H01L 24/30
(Continued)

(56) References Cited

U.S. PATENT DOCUMENTS

| 3,770,874 A | * | 11/1973 | Krieger | H01L 24/81 174/257 |
| 7,213,740 B2 | * | 5/2007 | Rinne | B23K 3/0623 228/180.22 |

(Continued)

FOREIGN PATENT DOCUMENTS

DE    2704833 A1 *  8/1978    ......... H01L 23/538

OTHER PUBLICATIONS

List of IBM Patents or Patent Applictions Treated as Related; (Appendix P), Date Filed Aug. 5, 2016, 2 pages.
(Continued)

*Primary Examiner* — George Fourson, III
(74) *Attorney, Agent, or Firm* — Cantor Colburn LLP; Vazken Alexanian

(57) ABSTRACT

A multi-chip system includes a top chip stack element comprising a top chip having two major surfaces and top solder pads arrayed along a plane of one of the major surfaces; a bottom chip stack element comprising a bottom substrate having two major surfaces and bottom solder pads arrayed along a plane of one of the major surfaces; one or more solder reservoir pads connected to one or more of the top solder pads or of the bottom solder pads; and solder material; and wherein at least one of the top solder pads is connected to one of the bottom solder pads by one of the solder material.

14 Claims, 12 Drawing Sheets

(51) Int. Cl.
*H01L 25/16* (2006.01)
*H01L 25/00* (2006.01)

(52) U.S. Cl.
CPC ............ *H01L 24/16* (2013.01); *H01L 25/167* (2013.01); *H01L 25/50* (2013.01); *H01L 23/49503* (2013.01); *H01L 24/30* (2013.01); *H01L 2224/0225* (2013.01); *H01L 2224/02245* (2013.01); *H01L 2224/0603* (2013.01); *H01L 2224/06515* (2013.01); *H01L 2224/09515* (2013.01); *H01L 2224/10145* (2013.01); *H01L 2224/11013* (2013.01); *H01L 2224/11462* (2013.01); *H01L 2224/16105* (2013.01); *H01L 2224/16145* (2013.01); *H01L 2224/81139* (2013.01); *H01L 2224/81203* (2013.01); *H01L 2224/81815* (2013.01)

(58) Field of Classification Search
USPC .......................................... 257/777; 438/108
See application file for complete search history.

(56) References Cited

U.S. PATENT DOCUMENTS

| | | | |
|---|---|---|---|
| 9,466,590 | B1 | 10/2016 | Barwicz et al. |
| 9,543,736 | B1 | 1/2017 | Barwicz et al. |
| 2002/0020551 | A1* | 2/2002 | Rinne ................ C08F 8/44 174/261 |
| 2002/0037025 | A1* | 3/2002 | Bartman .............. H01S 5/141 372/50.11 |
| 2003/0003624 | A1* | 1/2003 | Farooq ............. H01L 21/6835 438/108 |
| 2006/0192293 | A1* | 8/2006 | So ..................... H01L 23/40 257/778 |
| 2008/0293232 | A1* | 11/2008 | Kang ................. H05K 3/303 438/612 |
| 2016/0252688 | A1* | 9/2016 | Barwicz ............. G02B 6/4238 385/14 |
| 2017/0141072 | A1 | 5/2017 | Barwicz et al. |
| 2017/0146754 | A1 | 5/2017 | Barwicz et al. |

OTHER PUBLICATIONS

U.S. Appl. No. 14/941,041, filed Nov. 13, 2015; Entitled: Optimized Solder Pads for Microelectronic Components.
U.S. Appl. No. 14/947,621, filed Nov. 20, 2015; Entitled: Optimized Solder Pads for Microelectronic Components.
List of IBM Patents or Patent Applications Treated as Related; (Appendix P), Filed Jun. 21, 2017; 2 pages.
List of IBM Patents or Patent Applications Treated as Related; (Appendix P), Filed Sep. 27, 2017; 2 pages.

\* cited by examiner

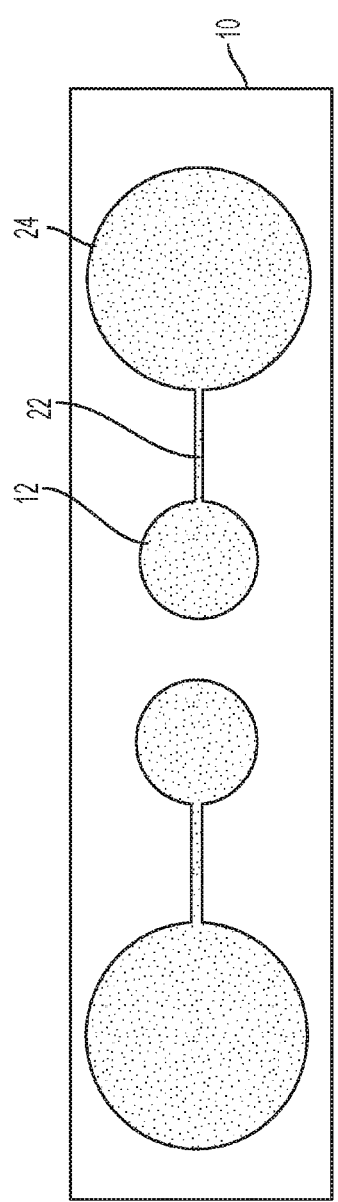
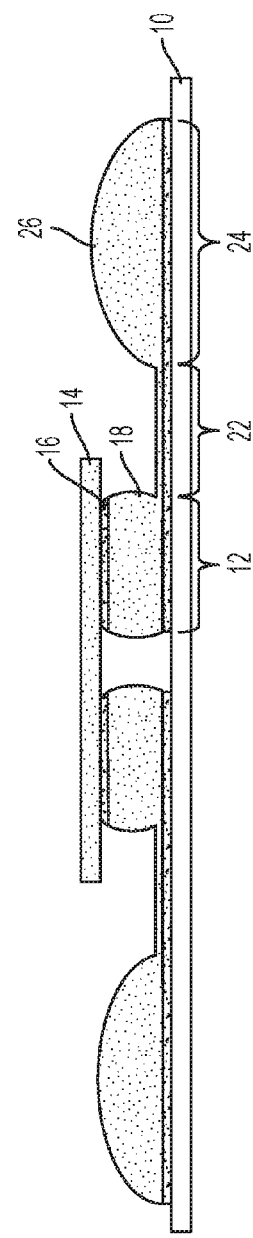
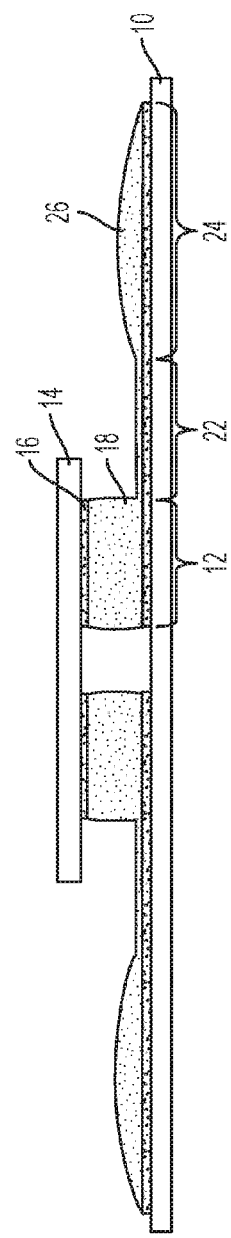
FIG. 2A
FIG. 2B
FIG. 2C

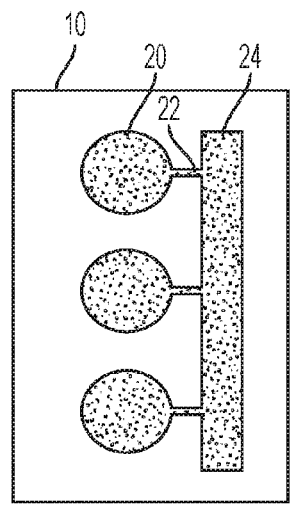
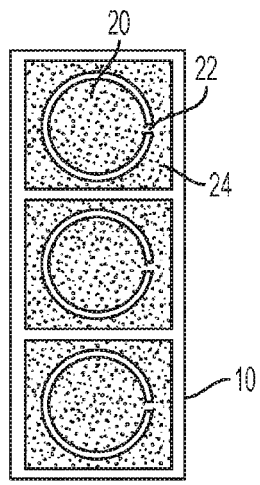
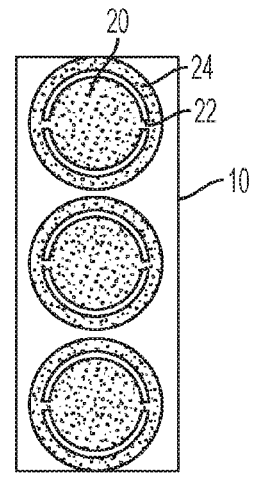
FIG. 3A  FIG. 3B  FIG. 3C
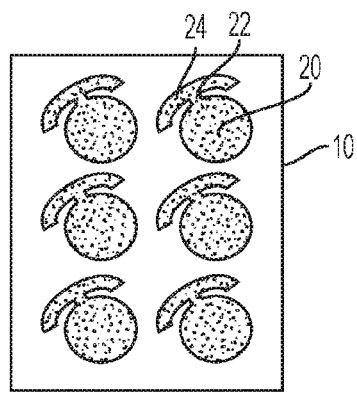
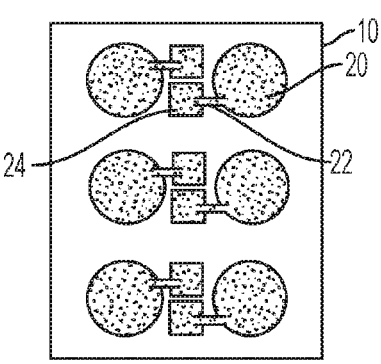
FIG. 3D  FIG. 3E

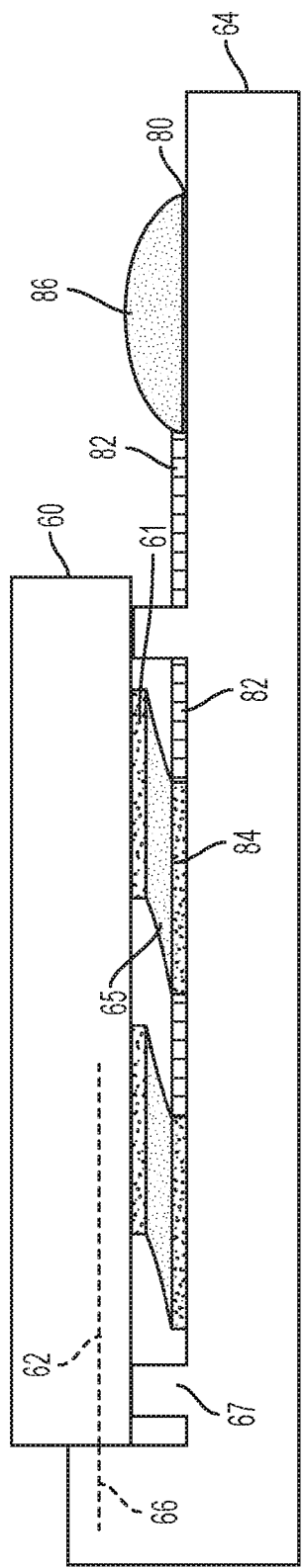
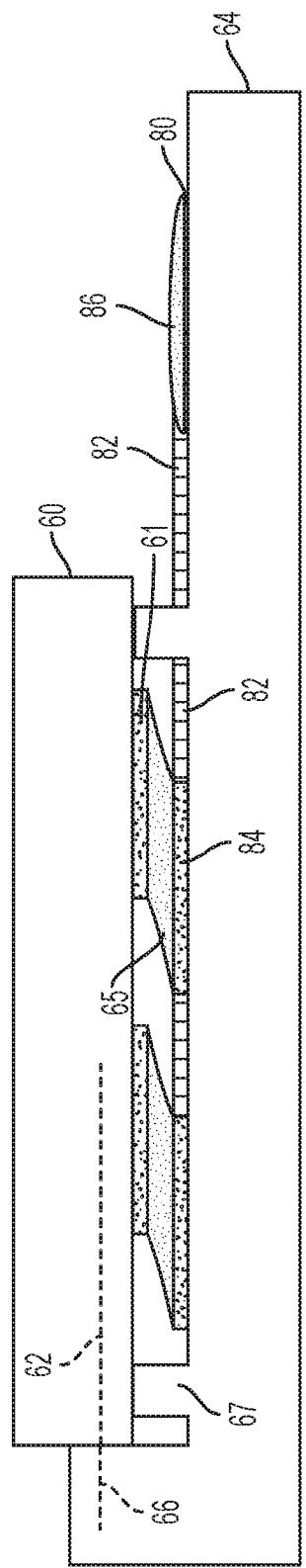
FIG. 9A
FIG. 9B

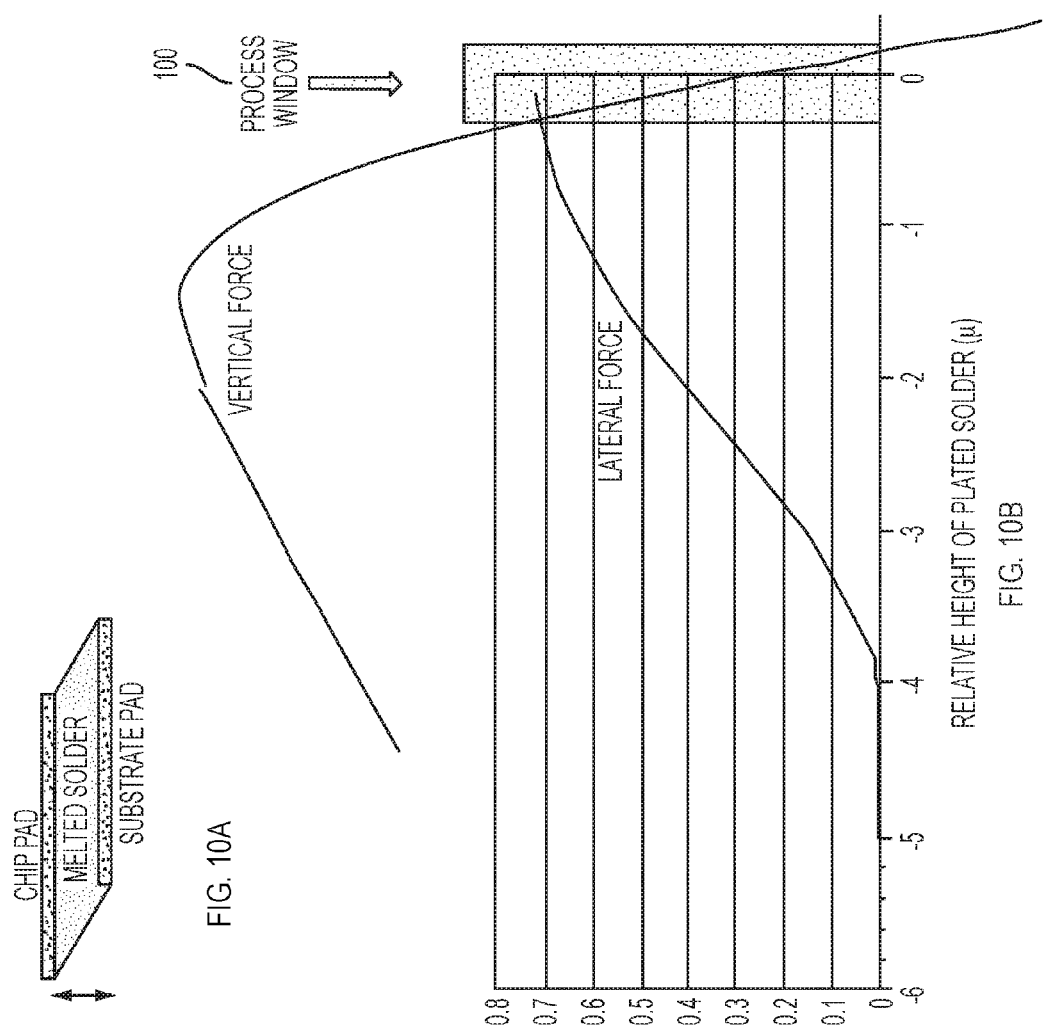

OPTIMIZED SOLDER PADS FOR MICROELECTRONIC COMPONENTS

DOMESTIC PRIORITY

This application is a Continuation of U.S. patent application Ser. No. 14/941,041 filed Nov. 13, 2015 entitled "OPTIMIZED SOLDER PADS FOR MICROELECTRONIC COMPONENTS," the contents of which in its entirety are incorporated by reference.

BACKGROUND

The present invention generally relates to semiconductor chip assembly, and more specifically, to optimized solder pads for flip chip bonding.

Solder pads can be used in the micro-electronics industry to make electrical and mechanical contacts or connections between integrated circuits (ICs) or between printed circuit boards (PCBs). Solder pads can also be used to make electrical and mechanical contacts or connections between opto-electronic and integrated photonic circuits and components.

To achieve such electrical and mechanical contacts and connections, the surfaces of two or more circuits to be connected can be coated with metal pads formed of one or more thin metal films, also and called Under-Bump Metallization pads (UBM pads) or solder pads. A bottom circuit of a two circuit assembly can be the larger of the two circuits and is also referred to herein as a substrate. A top circuit of a two circuit assembly can be the smaller of the two circuits and is also referred to herein as a chip.

Solder material, such as tin, indium, bismuth, or any combination of tin, silver, copper, gold, bismuth, indium or lead, can then be deposited on some of the metal pads on at least one of the circuits. This is typically accomplished through an electroplating process where the circuit is immersed in an electroplating bath during solder deposition. Optionally, solder paste printing, preform solder ball drop, or solder jetting method can be applied for solder deposition. Thereafter, the surfaces of two circuits to be connected can be brought into close contact and then temperature can be temporarily elevated beyond the melting temperature of the solder metal. When the solder metals are heated beyond the melting temperature, the melted solder can wick adjacent UBM pads and establish electrical contacts between the two circuits in close contact. Upon cooling, the solder can solidify to mechanically and electrically connect the two circuits.

The amount of solder deposited on UBM pads can impact the behavior and integrity of contacts between two circuits. Many applications using UBM pads and solder involve a very large number of potential solder connections and have a relatively small area on the chip between the solder connections. Adjusting the amount and uniformity of the solder on a large array of UBM pads can be a challenging task. If too little solder is used at a particular location, for example, an electrical connection can be incomplete or fragile to mechanical stress and fatigue, potentially resulting in system failure due to an electrical open circuit. On the other hand, if too much solder is used at a particular location, additional solder could result in bulges in the solder bumps and spurious contacts between adjacent solder bumps, potentially resulting in a failure due to an electrical shorting. Industry trends favoring ever smaller microelectronic components call for further reductions in space between solder contacts, while uniformity of solder plating can be on the order of 10% when wafers of 200 or 300 mm in diameter are plated. This can increase the potential of defects or degradation of the contacts and system failure.

Soldering applications can also be used during assembly of opto-electronic assemblies. Some applications call for alignment of chips in such assemblies on the order of micron or sub-micron precision. For example, semiconductor lasers generate infra-red radiation in a tightly confined channel, or waveguide, wherein the size of the beam emanating from the laser can be on a scale of one half a micron to 5 microns. In such applications, horizontal and vertical forces generated during solder melting of chip assembly can be used to assist with chip alignment. However, such applications can be highly sensitive to over-plating and under-plating of solder resulting from the electro-plating process.

SUMMARY

In one embodiment of the present invention, a multi-chip system includes a top chip stack element comprising a top chip having two major surfaces and top solder pads arrayed along a plane of one of the major surfaces; a bottom chip stack element comprising a bottom substrate having two major surfaces and bottom solder pads arrayed along a plane of one of the major surfaces; one or more solder reservoir pads connected to one or more of the top solder pads or of the bottom solder pads; and solder material; and wherein at least one of the top solder pads is connected to one of the bottom solder pads by one of the solder material.

In another embodiment, a multi-chip system includes a top chip stack element comprising a top chip having two major surfaces and top solder pads arrayed along a plane of one of the major surfaces; a bottom chip stack element comprising a bottom substrate having two major surfaces and integrated reservoirs arrayed along a plane of one of the major surfaces; and a plurality of solder material; wherein at least one of the top solder pads is connected to one of the integrated reservoirs by one of the solder material.

In another embodiment, a method of assembling a multi-chip system includes providing a top chip stack element comprising a top chip having two major surfaces and top solder pads arrayed along a plane of one of the major surfaces; providing a bottom chip stack element comprising a bottom substrate having two major surfaces, bottom solder pads arrayed along a plane of one of the major surfaces, conduits connected to one or more of the bottom solder pads, and a reservoir pad connected to each of the conduits; plating solder material on the bottom solder pads; aligning the top chip stack element and the bottom chip stack element to bring one or the top solder pads into proximity with the solder material; raising the temperature to melt the solder material; connecting the solder material to the top solder pads to form a connected assembly; and cooling the connected assembly to re-solidify the solder material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-5C illustrate a multi-chip system with a reservoir according to various embodiments of the present disclosure, in which:

FIG. 2A is a top view of a plated substrate having solder pads including a reservoir;

FIG. 2B is a side view of a portion of a circuit assembly with solder pads including a reservoir depicting an over-plated assembly;

FIG. 2C is a side view of a portion of a circuit assembly with solder pads including a reservoir depicting an under-plated assembly;

FIGS. 3A, 3B, 3C, 3D, and 3E are top views of various alternate embodiments of a plated substrate having solder pads including a reservoir;

FIGS. 4A-4C illustrate a multi-chip system including an integrated reservoir according to another embodiment of the present invention, in which FIG. 4A is a bottom view of a plated chip;

FIG. 4B is a top view of a plated substrate;

FIG. 4C is a side view of a plated assembly including an integrated reservoir.

FIGS. 5A-5C illustrate another embodiment of a multi-chip system including an integrated reservoir according to another embodiment of the present invention, in which FIG. 5A is a bottom view of a plated chip;

FIG. 5B is a top view of a plated substrate;

FIG. 5C is a side view of a plated assembly including an integrated reservoir.

FIGS. 6A-6C are cross-sectional side views of an opto-electronic assembly that illustrate solder-induced chip alignment, wherein;

FIG. 6A illustrates an opto-electronic chip over an opto-electronic substrate before solder has been melted;

FIG. 6B illustrates the motion of the opto-electronic chip during solder melting;

FIG. 6C illustrates a cross-sectional view of an opto-electronic chip over a an opto-electronic substrate after solder has been melted;

FIGS. 8A and 8B are cross-sectional side views of an opto-electronic assembly according to an embodiment of the disclosure, in which;

FIG. 8A illustrates a chip over a substrate before solder has been melted;

FIG. 8B illustrates a cross-sectional view of chip over a substrate after solder has been melted;

FIG. 9A is a cross-sectional side view of an opto-electronic assembly in accordance with the disclosure that illustrates alignment of the assembly after over-plating;

FIG. 9B is a cross-sectional side view of an opto-electronic assembly in accordance with the disclosure that illustrates alignment of the assembly after under-plating;

FIGS. 10A-10B illustrate calculated vertical and lateral forces in a conventional opto-electronic assembly, FIG. 10A represents a side view of a chip pad, melted solder, and substrate pad of an opto-electronic assembly, FIG. 10B is a chart of calculated relative height of plated solder versus vertical and lateral forces during assembly of the conventional assembly represented by FIG. 10A;

FIG. 11A reflects a 60 micron wide top chip pad and 100 micron wide bottom substrate pad. FIG. 11B reflects a 60 micron wide top substrate pad and 150 micron wide bottom substrate pad. FIG. 11C reflects a 60 micron wide top chip pad and 200 micron wide bottom substrate pad.

FIG. 12A is a top view of a portion of a substrate assembly depicting solder pads including a reservoir; FIG. 12B shows calculated horizontal and vertical forces versus plating for the portion of a substrate assembly in FIG. 12A.

DETAILED DESCRIPTION

Figure 1A:
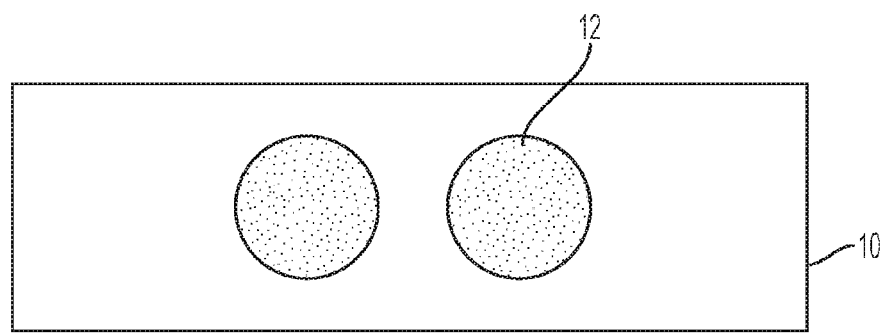
FIG. 1A is a top view of a conventional plated substrate.

As stated above, the present invention relates to semiconductor chip assembly, and more specifically, to optimized solder pads for self-aligned flip chip bonding. It is noted that like reference numerals refer to like elements across different embodiments.

Making electrical and mechanical contacts or connections between ICs and PCBs through the use of soldering applications can result in shorting or incomplete or fragile connections, particularly as devices are scaled down and demands are made for larger numbers of connections in a smaller area. Additionally, solder induced alignment of opto-electronic assemblies can be sensitive to over plating or under plating of solder when attempting to obtain the desired horizontal and vertical alignment during assembly.

For example, in a conventional flip-chip bonding process a pick and place tool may be used to place a chip face down on a substrate, where the chip contains solder on about 200 micron pitch, for example, controlled collapse chip connections (C4s), and the substrate contains matching solder pads. The combination can be passed through an oven, such as a reflow furnace, to join the chip to the substrate by melting the solder. The surface tension of the solder in the molten state can serve to self-align the chip to the substrate when the solder materials are placed on the appropriate solder pads.

Figure 1B:
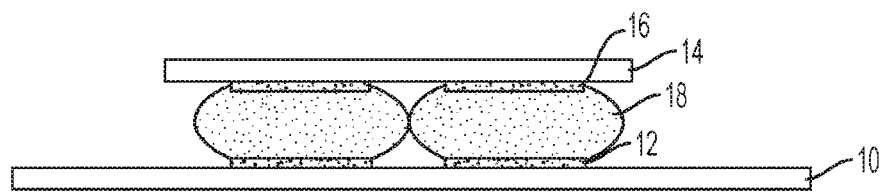
FIG. 1B is a side view of a portion of a conventional circuit depicting an over-plated assembly.
Figure 1C:
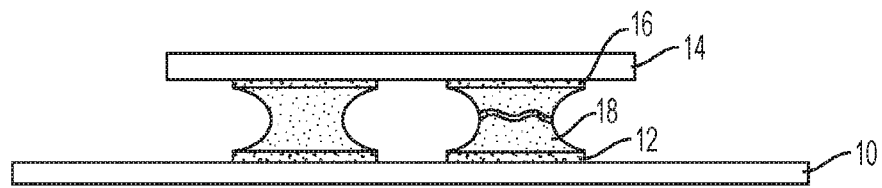
FIG. 1C is a side view of a portion of a conventional circuit depicting an under-plated assembly.

FIGS. 1A-1C illustrate a portion of a conventional plated substrate circuit. FIG. 1A illustrates a top view of a conventional plated substrate. As shown in FIG. 1A, a bottom solder pad 12 is plated or deposited onto a substrate 10. FIG. 1B depicts a side view of a portion of a conventional substrate circuit containing substrate 10 with bottom solder pad 12, a chip 14 having a top solder pad 16 plated thereon, and solder 18 between the top solder pad 16 and bottom solder pad 12 to form a mechanical and electrical connection. During assembly, or in packaging applications, solder material 18 can be deposited on either a substrate 10 or a chip 14. When the substrate 10 and chip 14 are brought into proximity, solder can be melted and re-solidified, for example by raising the temperature of the assembly above the melting temperature of the solder in an oven and then cooling the assembly. During the melting process, solder on the bottom solder pad 12, or alternatively the top solder pad 16, wets the UBMs of both substrate and chip and can form bonds with both of the bottom solder pad 12 and the top solder pad 16.

Soldering applications can be sensitive to the amount of solder plated at each connection site, such that too much or too little solder at any one site can result in failure of the entire assembly. FIG. 1B depicts an over-plated assembly, where solder 18 between adjacent solder pads bulges horizontally to the point of forming an electrical contact between adjacent connection sites. This can result in an electrical short in the finished circuit during operation and can render the circuit inoperative. FIG. 1C is a side view of a portion of a conventional substrate circuit depicting an under-plated assembly. After melting and re-solidifying, missing metal can render the solder connections fragile to mechanical stress and fatigue and potentially susceptible to fractures and electrical open circuits, which can also render the circuit inoperative. As scaling of such circuits continues, interconnect sensitivity to over-plating and under-plating of solder will be increasingly problematic.

With reference to, FIGS. 2A-2C, in one embodiment, an improved semiconductor chip assembly containing optimized solder pads is provided. As is seen in FIG. 2A, a bottom substrate 10 includes a bottom solder pad 12, a conduit 22, and a reservoir pad 24. The conduit links the bottom solder pad 12 to the reservoir pad 24 such that when solder material is molten, it can flow between the solder pad 12 and the reservoir pad 24.

In accordance with the disclosure, the bottom substrate and the top chip can contain any materials that can be used in a micro-electronics multi-chip system. For example, but not by way of limitation, the substrate can contain a ceramic material, such as sintered glass, a non-conductive organic material, or a semiconductor material, including for instance silicon, germanium, gallium, arsenide, or glass.

The solder pads (also referred to herein as Under Bump Metallization pads or UBM pads), reservoir pads, and conduits in accordance with the disclosure are metal films that can be single- or multi-layered, and each layer can contain a single metal or a blend of metals. Exemplary metals used in the pads include, but are not limited to, titanium, nickel, copper, and gold. Solder pads can be deposited on a surface by a variety of methods, including for instance electroplating, electrolessplating, vacuum deposition by evaporation or sputtering, or by chemical vapor deposition. In some embodiments, solder pads are deposited on a substrate by electroplating. In some embodiments, the thickness of the solder pads is 1 to 100 microns, such as 10 to 50 microns.

In accordance with the disclosure, solder material is deposited onto one or more solder pads. Solder material can be any solder metal used for circuit assembly, such one of tin, bismuth, indium of any combination of tin (Sn), silver (Au), copper (Cu), gold (Ag), bismuth (Bi), indium (In), or lead (Pb). For example, in some embodiments, solder materials is Sn, Bi, In, SnAg, SnCu, SnAgCu, SnBi, InSn, or SnPb.

FIG. 2B is a side view of a portion of a substrate circuit assembly including the plated substrate of FIG. 2A, wherein the assembly is over-plated. As is seen in FIG. 2B, when solder material 18 is in excess in the over-plated assembly, during the molten phase the excess solder can flow through conduit 22 into reservoir pad 24, and thereby avoid forming a connection between adjacent connection sites. In accordance with the disclosure, solder material 18 can be deposited prior to circuit assembly on the top chip 14 or the bottom substrate 10 and/or can be deposited on the substrate along with or on top of the substrate pad. In some embodiments, the solder material is deposited prior to circuit assembly on the bottom substrate 10. In some embodiments, the solder material is deposited prior to circuit assembly on the top chip 14. In some embodiments, the solder material is deposited prior to circuit assembly on one substrate pad and a reservoir pad connected to the substrate pad. FIG. 2C is a side view of a portion of a circuit assembly including the plated substrate of FIG. 2A, wherein the assembly is under-plated. As is seen in FIG. 2B, when solder material 18 on the bottom solder pad 12 is plated in an amount that would otherwise render the connection fragile or incomplete, solder material 18 can flow from the reservoir pad 24 through conduit 22 to the bottom solder pad 12 to form a connection between the bottom solder pad 12 and top solder pad 16.

Without being bound by theory, it is believed that the conduits allow flow of the melted solder material in a process driven by surface tension and pressure inside the liquid solder. The driver of the flow is reflected by the following equation, wherein $\Delta p$ represents the pressure difference inside versus outside the liquid, $\gamma$ represents the surface tension constant of the liquid solder material (typically around 0.5 Newton (N) per meter (m)) and Rx and Ry represent the two radii of curvature of the liquid surface of the solder material at a given point of the surface (either on the solder pad or on the reservoir pad).

$$\Delta p = \gamma \left( \frac{1}{R_x} + \frac{1}{R_y} \right)$$

During the melting phase of plating, the liquid solder is continuous between a solder pad and the reservoir pad through the conduit. Thus, the pressure in the liquid in the solder pads and reservoir pads is constant and the surface curvature, characterized at any point by [1/Rx+1/Ry], therefore, will be similar. At the start of melt during over-plating, it is believed that the solder pads have a smaller radius of curvature and, hence, a larger pressure in which to drive the liquid solder through the conduit to the reservoir pad. Conversely, in under-plating, the solder pads have a larger and potentially negative radius of curvature and, hence, a lower pressure, which forces some liquid solder from the reservoir pad through the conduit to the solder pad.

Although FIGS. 2A-2C depict circular reservoir pads 24 and solder pads 20, the disclosure is not limited to circular pads. As seen in FIGS. 3A-3E, solder pads 20, reservoir pads 24, and conduits 22 can have a variety of shapes and sizes. In some embodiments, the solder pads or reservoir pads are circular. In some embodiments, the solder pads or reservoir pads are rectangular, square, elliptical, or triangular. In some embodiments, the reservoir pads and the solder pads are the same shape. In some embodiments, the reservoir pads and the solder pads are different shapes. In some embodiments, as is depicted in FIG. 3A for example when electrical connectivity between multiple sites is not detrimental, multiple solder pads 20 can be connected to a single reservoir pad 24 to provide level or balanced solder plating across several sites. In some embodiments, as is shown for instance in FIGS. 3B-3E, one of several solder pads 20 is connected via a conduit to one of several reservoir pads 24 on a substrate 10.

In some embodiments, the reservoir pad area is commensurate to the solder pad area. A larger reservoir pad can, in some embodiments, provide correction for a wider range of over-plating or under-plating. When substrate space is restricted, for instance as is shown in FIGS. 3B and 3C, the reservoir pad 24 area can be reduced and/or the reservoir pad 24 location can be adjusted to accommodate spatial restrictions.

Figure 4A:
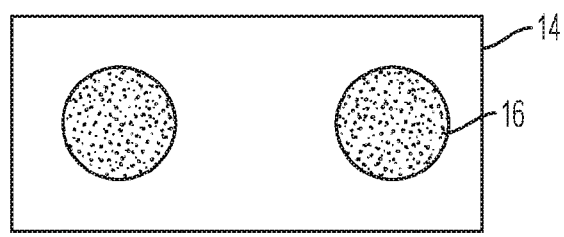
Figure 4B:
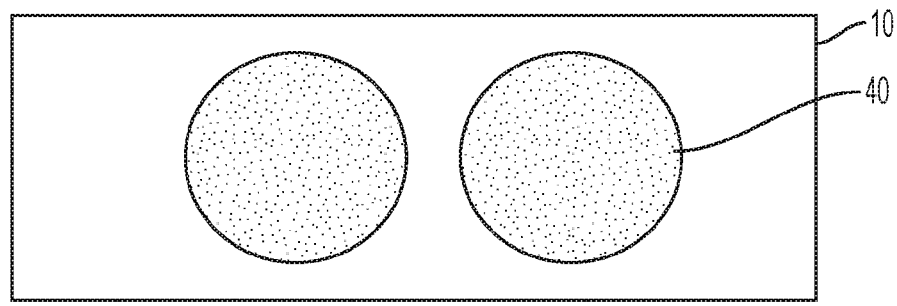
Figure 4C:
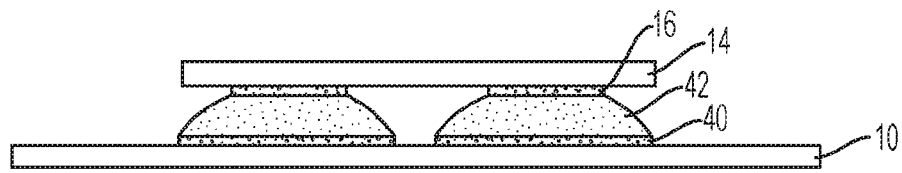

In another embodiment, and as is shown in FIGS. 4A-4C and 5A-5C, a reservoir pad can be integrated with a substrate pad or a chip pad, forming an integrated reservoir. The integrated reservoir is the portion of the pad that is not directly overlapping with the adjoining pad. FIG. 4A depicts a bottom view of a top chip 14 and top solder pads 16 and FIG. 4B depicts a top view of a corresponding bottom substrate 10 and an integrated reservoir 40. FIG. 4C is a side view of a part of a multi-chip system including the top chip 14 and top solder pads 16 of FIG. 4A, the bottom substrate 10 and integrated reservoir 40 of FIG. 4B, and solder material ball 42 connecting the top solder pads 16 to the bottom integrated reservoir 40, forming an electrical and mechanical connection between the top chip 14 and bottom substrate 10. The integrated reservoir 40 includes a reservoir component and a solder plate component in accordance with the disclosure, wherein the reservoir component is the non-overlapping area of UBM between the top chip and the bottom substrate. The reservoir area can provide an additional surface of solder that can swell or shrink to accommodate over or under plating.

Figure 5A:
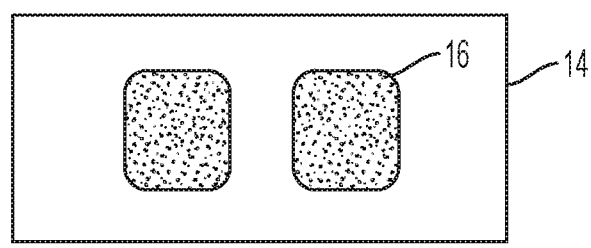
Figure 5B:
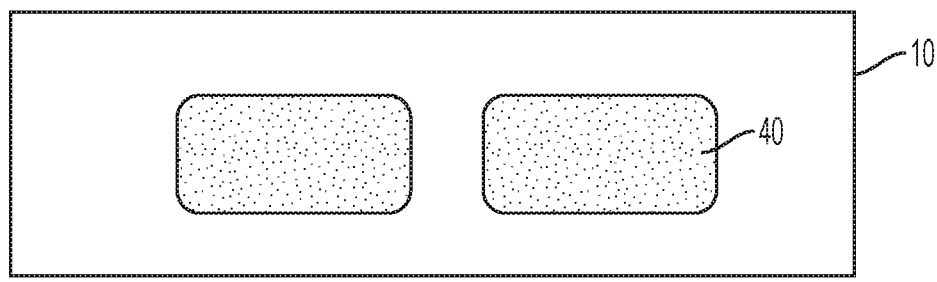
Figure 5C:
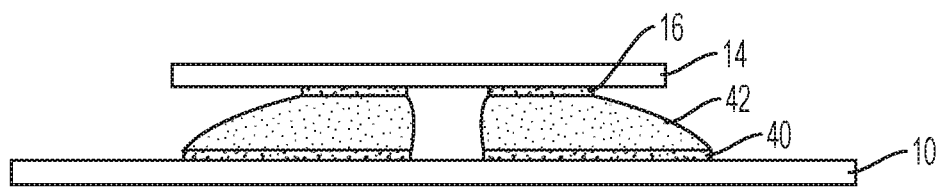

In some embodiments, the integrated reservoir is circular. However, the disclosure is not limited to integrated reservoirs of any particular shape or size. In some embodiments, for instance as is shown in FIGS. 5A-5C, the integrated reservoir 40 can be rectangular and the corresponding top solder pad 16 can be square.

In some embodiments, the top solder pads can be co-centered in a multi-chip assembly, as is shown in FIG. 4C. In some embodiments, as is shown for instance in FIG. 5C, the top solder pads 16 and the integrated reservoir 40 are off-center. A variety of combinations of shapes and degree of centeredness can be used in accordance with the disclosure where the reservoir pads 40 have an area that is larger than the top solder pads.

In preferred embodiments, the integrated reservoir has an area that is greater than or equal to 20% larger than the area of the top solder pad. In some embodiments, the integrated reservoir has an area that is from one half to four times the area of the top solder pad. In a preferred embodiment, the integrated reservoir has an area that is twice the area of the top solder pad.

In some embodiments, the multi-chip system according to the disclosure is an opto-electronic system. For example, in some embodiments, the top chip stack element and bottom chip stack element can be components of an opto-electronic assembly, such as a semiconductor laser on top of a silicon photonic chip.

Figure 6A:
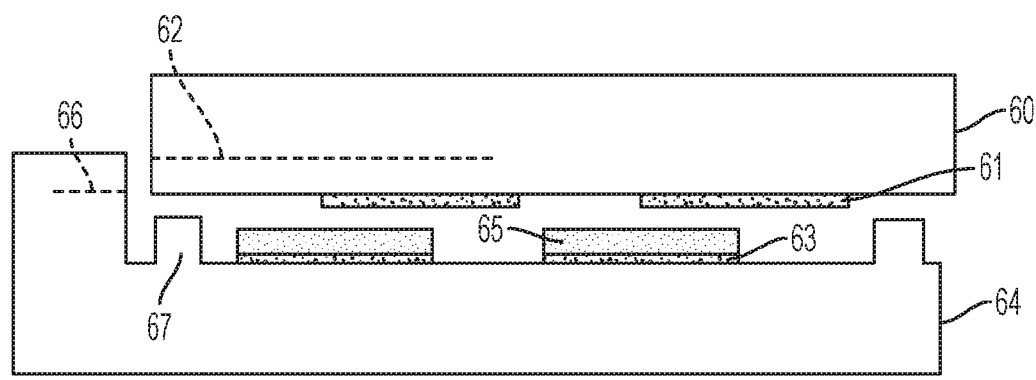
Figure 6B:
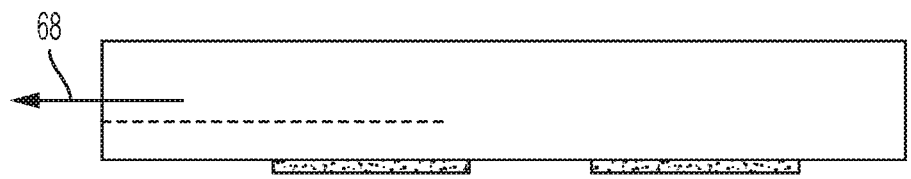
Figure 6C:
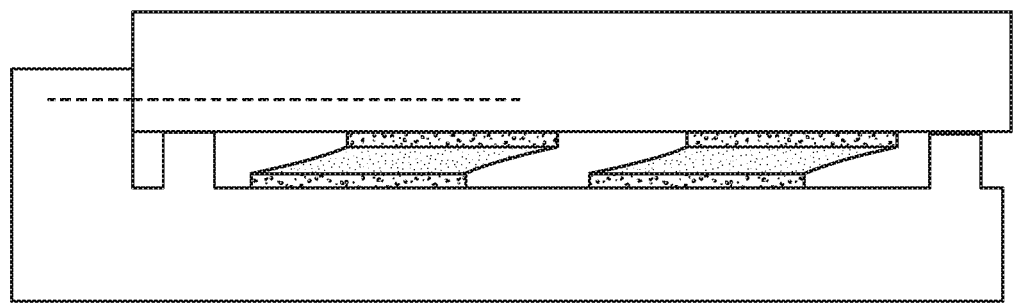

FIGS. 6A-C depicts an opto-electronic system that uses solder induced chip alignment. FIG. 6A shows a cross sectional view of an opto-electronic assembly prior to solder melting. A top opto-electronic chip 60 contains a top waveguide 62 and top opto-electronic solder pads 61. A bottom opto-electronic substrate 64 contains a mechanical stop or standoff 67, a bottom waveguide 66, bottom opto-electronic solder pads 63, and plated solder 65 connected to the bottom solder pads 63. The waveguide, in some embodiments, can be a channel in which to pass a light wave or radiation, such as a semiconductor laser that generates infra-red radiation. Such waveguides can be relatively small depending on the application. For instance, the size of the cross-sectional energy distribution of the photonic mode emanating from a semiconductor laser can be on the order of 0.5 to 5 microns. As is shown in FIG. 6A, prior to solder melting, the top opto-electronic chip 60 is adjacent to the bottom opto-electronic substrate 64, such that the opto-electronic solder pads of the top and bottom overlap, but are not directly positioned above one another in the vertical plane.

FIG. 6B depicts the desired movement 68 of the top opto-electronic chip 60 during solder melting. The top opto-electronic chip in the depicted self-aligned assembly can only move in the horizontal direction where the vertical direction is constrained by either the standoff 67 height or the solder 65 height. The horizontal movement is enabled through the solder melt, which asserts a horizontal and a vertical force due to the surface tension of the melted solder. FIG. 6C illustrates a cross-sectional view of an opto-electronic chip over an opto-electronic substrate after solder has been melted and re-solidified. As is shown, the solder 65 forms an electrical and mechanical connection between the top opto-electronic chip 60 and the bottom opto-electronic substrate 64. When the top opto-electronic chip 60 and bottom opto-electronic substrate 64 are correctly assembled, top waveguide 62 and bottom waveguide 66 are aligned such that light or radiation emitted by the assembly will be coupled into the waveguide of the assembly.

Figure 7A:
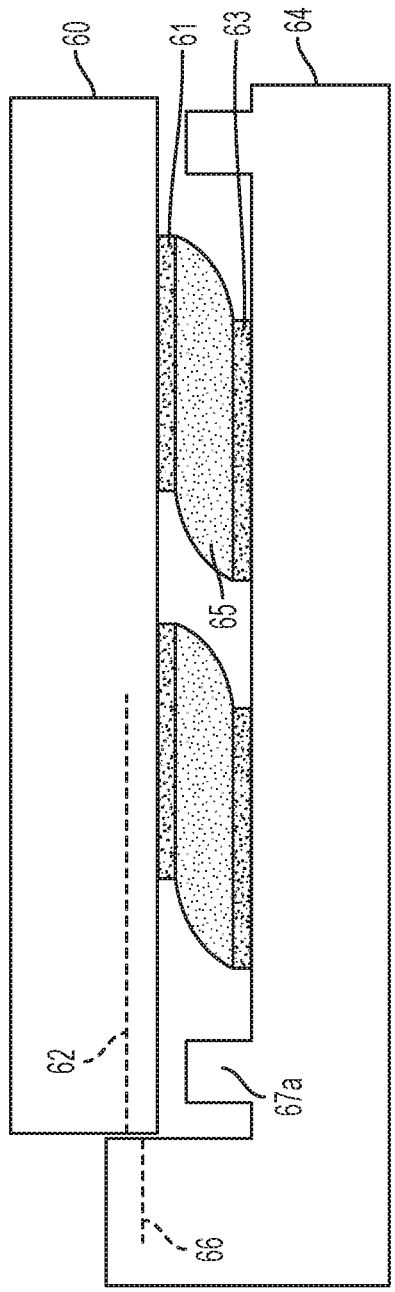
FIG. 7A is a cross-sectional side view of an opto-electronic assembly that illustrates misalignment of the assembly due to over-plating.

FIG. 7A illustrates misalignment of the waveguide in an opto-electronic assembly that can occur when solder is over-plated. As is shown, the chip 60 moved in the horizontal direction but remains too high over the substrate due to excess solder 65.

Figure 7B:
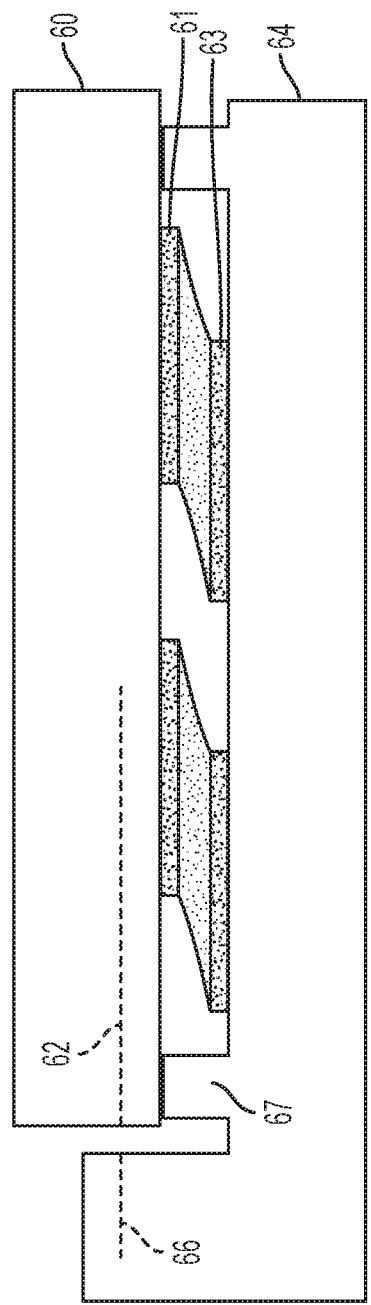
FIG. 7B is a cross-sectional side view of an opto-electronic assembly that illustrates misalignment of the assembly due to under-plating.

FIG. 7B illustrates misalignment of the waveguide in an opto-electronic assembly that can occur when solder is under-plated. As is shown, the chip 60 moved in the downward direction but did not move a sufficient distance in the horizontal direction. Without being bound by theory, it is believed that the vertical downward force in such a case is large compared to the horizontal force and friction over standoffs 67 then hinders the chip horizontal motion such that the waveguides fail to align properly.

Figure 8A:
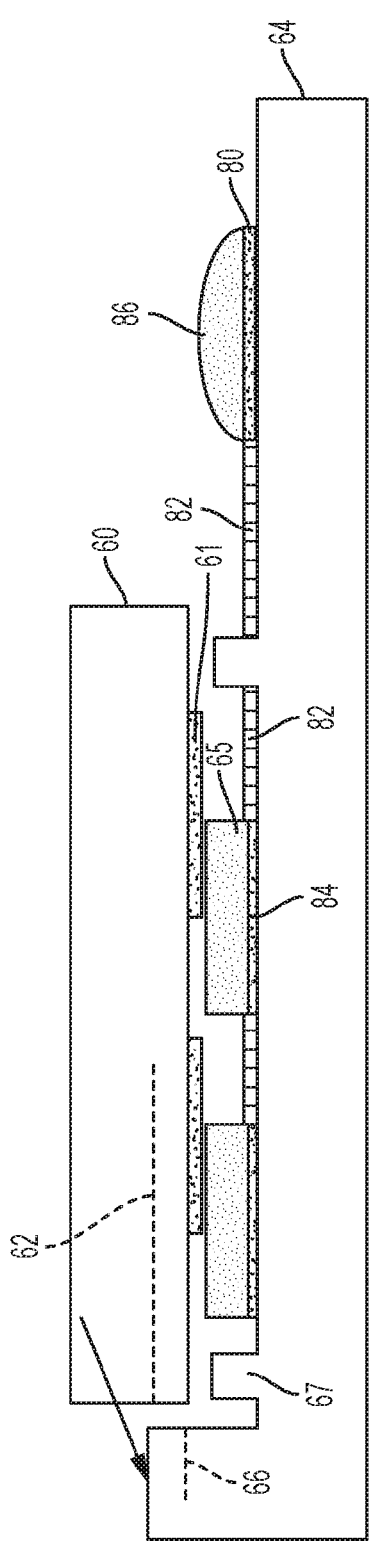
Figure 8B:
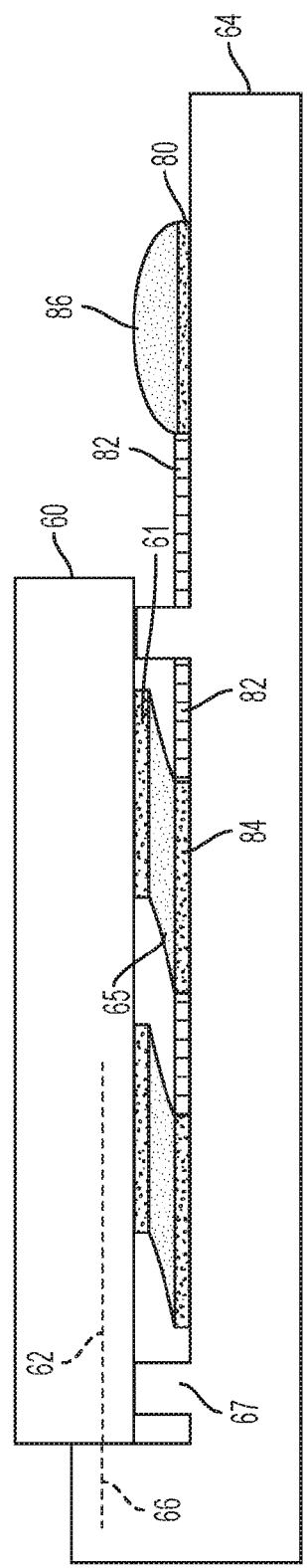

FIGS. 8A-B depict an opto-electronic assembly according to an embodiment of the disclosure. FIG. 8A depicts a cross sectional view of an opto-electronic assembly according to the disclosure prior to solder melting. A top opto-electronic chip 60 contains a top waveguide 62 and top opto-electronic solder pads 61. A bottom opto-electronic substrate 64 contains a mechanical stop or standoff 67, a bottom waveguide 66, bottom solder pads 84, and plated solder 65 connected to the bottom solder pads 84. The bottom solder pads 84 are connected via a conduit 82 to one or more opto-electronic reservoir pads 80. In some embodiments, the opto-electronic reservoir pads are plated with reservoir solder 86. As is shown in FIG. 8A, prior to solder melting, the top opto-electronic chip 60 is adjacent to the bottom opto-electronic substrate 64, such that the opto-electronic solder pads of the top and bottom overlap, but are not directly positioned above one another in the vertical plane. FIG. 8B illustrates a cross-sectional view of the assembly of FIG. 8A after solder has been melted.

FIG. 9A depicts a cross sectional view of the opto-electronic assembly depicted in FIG. 8A after solder has been melted and re-solidified in the case of over-plating. As is shown, most of the excess solder can flow to the opto-electronic reservoir pad 80 and the chip is able to move horizontally and vertically and to land on the standoffs 67 with proper waveguide alignment.

As mentioned earlier, the flow of solder and the direction of the flow can be governed by the pressure inside the liquid solder, which is a function of the curvature of the solder surface. With the absence of a reservoir and connecting conduit, the curvature of the solder bulges 65 on FIG. 8A is relatively large. This large curvature corresponds to a high pressure in the solder material 65. On the other hand, the curvature of the solder on the reservoir is smaller and hence the pressure is lower. The difference in pressure can force some of the solder material to move from the solder pads 65 to the reservoir 80 on FIG. 9A. The lower pressure in the solder material 65 also allows the chip to move down until it lands on the standoffs 67.

Pressure-induced solder flow can occur when the width of the reservoir is larger than the width of the bottom solder pads 84. In some embodiments, the reservoir pad area is from one to two times the size of area of the bottom solder pad. In some embodiments, the reservoir pad is plated with solder prior to assembly.

FIG. 9B depicts a cross sectional view of the under plated opto-electronic assembly depicted in FIG. 8A after solder has been melted and re-solidified in the case of under-plating. During melting, some solder material has flowed from the reservoir pad 80 to the opto-electronic bottom solder pad 84 through a conduit 82 and the chip is able to move horizontally and vertically and to land on the standoffs 67 with waveguide alignment. The direction of the solder flow can be dictated by the low pressure of the liquid solder 65 between the solder pads, due to the very low curvature (and possibly even negative curvature) of the solder surface between the solder pads. Solder flow and chip motion occur preferentially when e the reservoir is larger than the solder pads 61 and 84. In some embodiments, the reservoir pad area is from one to two times the size of area of the top or bottom solder pad. In some embodiments, the reservoir pad is plated with solder prior to assembly. In some embodiments, the opto-electronic assembly includes an integrated reservoir as described herein.

FIGS. 10A-10B illustrate calculated vertical and lateral forces in a conventional opto-electronic assembly. FIG. 10A represents a side view of a chip pad, melted solder, and substrate pad of an opto-electronic assembly. FIG. 10B is a chart of calculated vertical and lateral forces versus relative height of plated solder during assembly of the conventional assembly represented by FIG. 10A. As is shown, lateral force and vertical force calculated during solder melt can vary based upon the height of plated solder. The process window 100 wherein the lateral and vertical forces allow for waveguide alignment in a conventional opto-electronic assembly is relatively narrow.

Figure 11A:
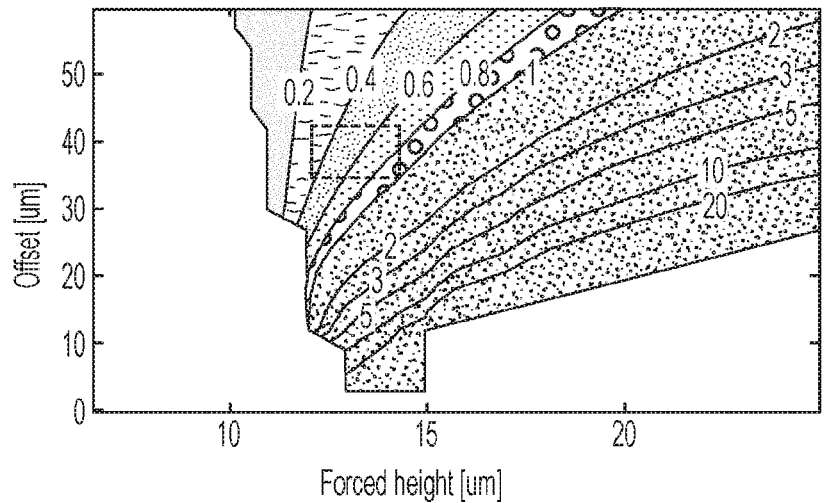
FIGS. 11A-11C illustrate calculated ratio of force to offset in optoelectronic assemblies of various embodiments.
Figure 11B:
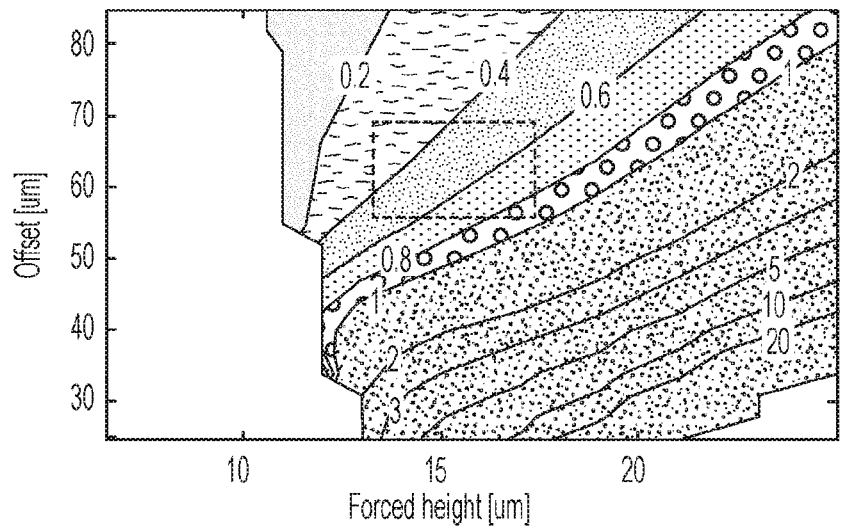
Figure 11C:
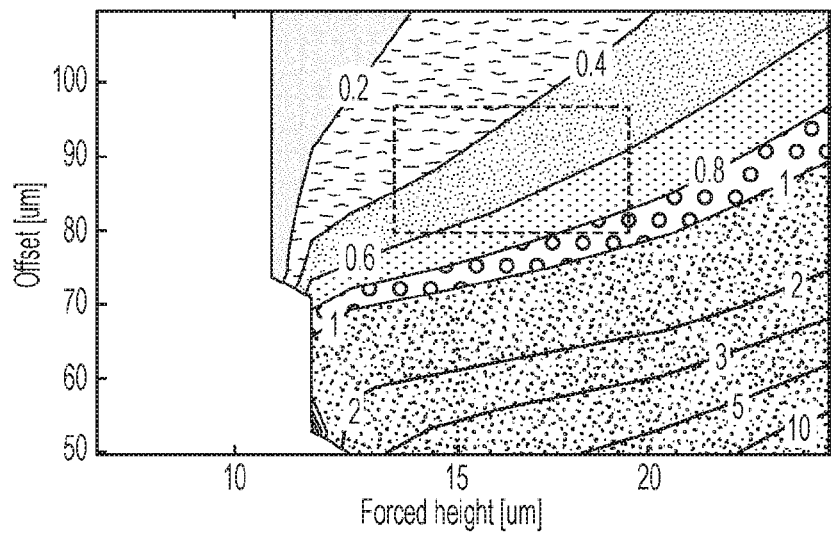

FIGS. 11A-11C illustrate the calculated ratio of vertical to horizontal forces that is applicable to the case of integrated reservoirs. The area of the bottom solder pad is extended so as to serve as integrated reservoir. The calculations also examine the effect of pad offset (on the vertical axes) and solder height (on the horizontal axes) to the force ratio. FIG. 11A represents an assembly including a 60 micron wide top solder pad and 100 micron wide bottom solder pad in an integrated reservoir. FIG. 11B reflects a 60 micron wide top solder pad and 150 micron wide bottom solder pad. FIG. 11C reflects a 60 micron wide top solder pad and 200 micron wide bottom solder pad. As is shown, process windows of various sizes, depicted by the dashed line in FIGS. 11A-11C, can be obtained by varying the relative sizes of a top and bottom solder pads in an assembly including an integrated reservoir.

Figure 12A:
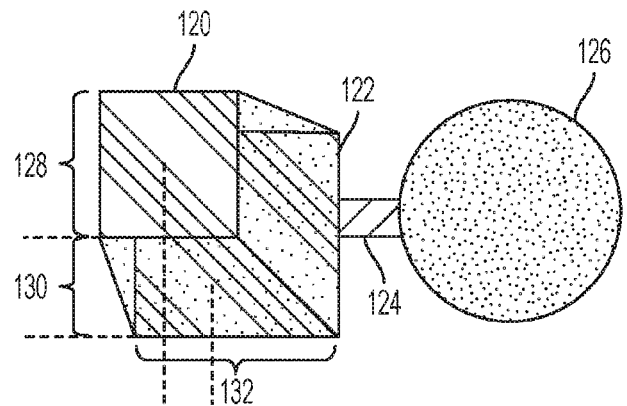
FIGS. 12A-12B illustrate calculations of vertical and lateral forces exerted by melted solder.
Figure 12B:
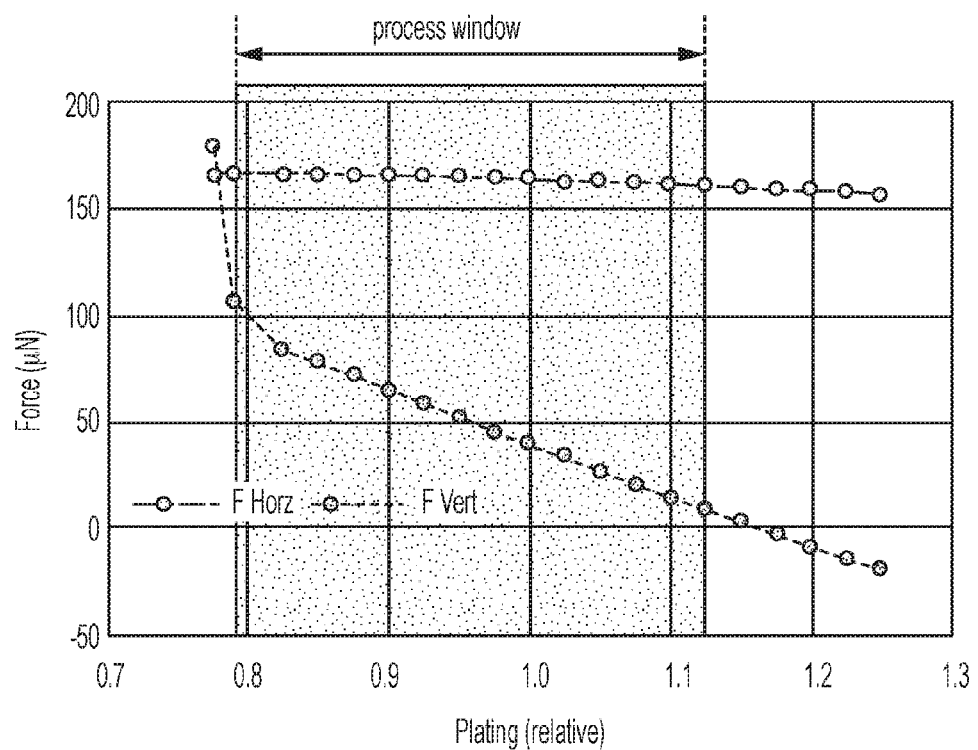

FIGS. 12A-12B illustrate calculations of vertical and lateral forces exerted by melted solder in micro Newtons (μN) in an assembly including a reservoir pad and a conduit versus relative plating. FIG. 12A is a top view of a portion of a substrate assembly including a reservoir pad 126 of radius Rres and with plated solder in the reservoir of height Hres, a conduit 124, bottom solder pad 122 of a length and width 132, and top solder pad 120 of a length and width 128, wherein the distance between the top solder pad 120 and bottom solder pad 122 is a given height 130; FIG. 12B shows a graphical representation of calculated horizontal and vertical forces versus relative plating for the portion of a substrate assembly in FIG. 12A in micro Newtons for a 10 micron nominal plating thickness, an offset between pad centers of −30 microns, wherein length and width of the bottom solder pad 132 are each 101 microns, length and width of the top solder pad 128 are each 80 microns, and the distance between the top solder pad and bottom solder pad 130 is 15 microns, and having reservoir radius of 50 microns. As is shown, a wide process window of about 30%, corresponding to a relative plating window of 0.8 to 1.1, can be achieved.

In some embodiments reservoir solder can be composed of the same material as the solder plated on the connected solder pads. In some embodiments, reservoir solder is composed of different materials than the connected solder plated on the solder pads. In such embodiments, it can be possible to selectively melt reservoir solder at a different temperature, such as a higher temperature, than the solder in the pads. In solder induced alignment, for instance, in some embodiments, reservoir solder melts at a higher temperature such that chips are first aligned in the horizontal direction in an over plated assembly. The over plating can prevent friction from the standoffs from halting the movement of the chip in the horizontal direction. Next, the temperature can be raised to melt reservoir solder, providing space for excess solder in the solder pads to flow into the reservoir and, thus, allowing vertical movement of the chip to achieve waveguide alignment.

The disclosure also relates to methods of assembling a multi-chip system. In some embodiments, the method includes providing a top chip stack element comprising a top chip having two major surfaces and top solder pads arrayed along a plane of one of the major surfaces. The method also includes providing a bottom chip stack element comprising a bottom substrate having two major surfaces, bottom solder pads arrayed along a plane of one of the major surfaces, conduits connected to one or more of the bottom solder pads, and a reservoir pad connected to each of the conduits. The method of the disclosure includes plating solder material on the bottom solder pads. The method also includes aligning the top chip stack element and the bottom chip stack element to bring one or the top solder pads into proximity with the solder material. The method further includes raising the temperature to melt the solder material, connecting the solder material to the top solder pads to form a connected assembly; and then cooling the connected assembly to re-solidify the solder material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-chip system, comprising
a top chip stack element comprising a top chip having two major surfaces and top solder pads arrayed along a plane of one of the major surfaces;
a bottom chip stack element comprising a bottom substrate having two major surfaces, bottom solder pads arrayed along a plane of one of the major surfaces, and a standoff;
one or more solder reservoir pads connected to one or more of the top solder pads or of the bottom solder pads; and
solder material;
wherein at least one of the top solder pads is connected to one of the bottom solder pads by one of the solder material,
wherein the top chip stack element is a first opto-electronic component comprising a first waveguide and the bottom chip stack element is a second opto-electronic component comprising a second waveguide, and wherein the first waveguide and the second waveguide are aligned; and
wherein the bottom solder pad is horizontally offset from the top solder pad by at least 20% of either pad dimension.

2. The multi-chip system of claim 1, wherein the at least one of the solder material contacts one of the solder reservoir pads.

3. The multi-chip system of claim 1, further comprising a conduit, wherein the conduit connects one of the top solder pads or one of the bottom solder pads to one of the reservoir pads.

4. The multi-chip system of claim 3, wherein the solder pad and conduit comprise a metal selected from the group consisting of titanium, chromium, copper, nickel, iron, aluminum, silver and gold.

5. The multi-chip system of claim 1, wherein the solder material comprises a metal selected from the group consisting of tin, silver, gold, lead, bismuth, and indium.

6. The multi-chip system of claim 1, wherein the bottom solder pad has an area that is larger than the area of the top solder pad by at least 20%.

7. The multi-chip system of claim 1, wherein the reservoir pads has an area that is from 0.5 to 10 times the area of either top or bottom solder pads.

8. A multi-chip system, comprising
a top chip stack element comprising a top chip having two major surfaces and top solder pads arrayed along a plane of one of the major surfaces;
a bottom chip stack element comprising a bottom substrate having two major surfaces, integrated reservoirs arrayed along a plane of one of the major surfaces and a standoff; and
a plurality of solder material;
wherein at least one of the top solder pads is connected to one of the integrated reservoirs by one of the solder material; and
wherein the top chip stack element is a first opto-electronic substrate comprising a first waveguide and the bottom chip stack element is a second opto-electronic substrate comprising a second waveguide, and wherein the first waveguide and the second waveguide are aligned; and
wherein the bottom solder pad is horizontally offset from the top solder pad by at least 20% of either pad dimension.

9. The multi-chip system according to claim 8, wherein the integrated reservoir has an area that is greater than or equal to 20% larger than the area of the adjoining top solder pad.

10. A method of assembling a multi-chip system, comprising:
providing a top chip stack element comprising a top opto-electronic component having two major surfaces and top solder pads arrayed along a plane of one of the major surfaces, wherein the top opto-electronic component comprises a first waveguide;
providing a bottom chip stack element comprising a bottom opto-electronic component having two major surfaces, bottom solder pads arrayed along a plane of one of the major surfaces, a conduits connected to one or more of the bottom solder pads, and a reservoir pad connected to each of the conduits, wherein the bottom opto-electronic component comprises a second waveguide;
plating a first solder material on the bottom solder pads;
plating a second solder material on the reservoir pads;
aligning the top chip stack element and the bottom chip stack element to bring one or the top solder pads into proximity with the solder material;
raising the temperature to melt both of the first solder material and the second solder material;
connecting the solder material to the top solder pads to form a connected assembly in which the bottom solder pads are horizontally offset from the top solder pad by at least 20% of either pad dimension;
aligning the first waveguide and the second waveguide; and
cooling the connected assembly to re-solidify both of the first solder material and the second solder material.

11. The method of claim 10, the method further comprising after melting the reservoir solder material, flowing the melted solder material from the bottom solder pads to the reservoir pads.

12. The method of claim 10, further comprising, after raising the temperature to melt the solder material, flowing melted solder material from the bottom solder pad to the reservoir pads.

13. The method of claim 8, wherein the reservoir pads have an area that is from 0.5 to 4 times larger than the area of the bottom solder pads.

14. The method of claim 13, wherein the reservoir pads have an area that is 2 times larger than the area of the bottom solder pads.

* * * * *